United States Patent [19]

Swan

[11] 3,916,350

[45] Oct. 28, 1975

[54] PACKAGED IMPATT OR OTHER MICROWAVE DEVICE WITH MEANS FOR AVOIDING TERMINAL IMPEDANCE DEGRADATION

[75] Inventor: Clarence Burke Swan, Lower Macungie Township, Lehigh County, Pa.

[73] Assignee: Bell Telephone Laboratories Incorporated, Murray Hill, N.J.

[22] Filed: Mar. 27, 1974

[21] Appl. No.: 455,124

[52] U.S. Cl...................... 333/32; 333/33; 333/97 R

[51] Int. Cl.²..................... H03H 7/38; H01L 23/28

[58] Field of Search ... 333/97 R, 84 R, 84 M, 80 R, 333/80 T, 31–33; 331/107 G, 115, 117 D, 74; 357/72, 75

[56] References Cited

UNITED STATES PATENTS

| | | | |
|---|---|---|---|
| 3,255,421 | 6/1966 | Skalski | 333/80 R X |
| 3,500,244 | 3/1970 | Gleeson | 333/84 X |
| 3,621,463 | 11/1971 | Olson, Jr. | 331/101 |
| 3,701,049 | 10/1972 | VanImperen et al. | 331/107 R |
| 3,745,487 | 7/1973 | Milard et al. | 333/33 X |
| 3,838,443 | 9/1973 | Laighton | 333/84 M X |

*Primary Examiner*—Eli Lieberman
*Assistant Examiner*—Marvin Nussbaum
*Attorney, Agent, or Firm*—Wilford L. Wisner

[57] ABSTRACT

The low terminal impedance of a packaged IMPATT diode or other solid state microwave device is avoided and a provision for impedance matching to a load is made by providing an extra terminal to one end of the diode for load connection, while connecting the other terminal at that end to a shunt reactance tuning circuit. The result is a higher radio-frequency impedance at the load terminal than in the absence of the extra connection because of the reduced reactive current flowing in this load terminal.

3 Claims, 3 Drawing Figures

IMPEDANCE-MATCHED CIRCUIT

EQUIVALENT CIRCUIT

PACKAGED IMPATT OR OTHER MICROWAVE DEVICE WITH MEANS FOR AVOIDING TERMINAL IMPEDANCE DEGRADATION

BACKGROUND OF THE INVENTION

This invention relates to circuit techniques for the impedance matching of IMPATT diodes and similar semiconductor devices and more specifically to circuit arrangements that raise the effective output impedances of individually packaged forms of such diodes.

Semiconductor transit time oscillators such as IMPATT diode oscillators and other semiconductor oscillators using low impedance negative resistance devices are becoming increasingly important in microwave apparatuses and systems. In particular, it has been shown that IMPATT diodes are capable of very desirable performance over extended periods of time. They can be manufactured in great quantities at low cost and are promising for even broader application in the future than exists at present.

Nevertheless, it is still difficult to avoid the unfavorable low terminal impedances characteristic of IMPATT diodes mounted in conventional packages, i.e., the assembly in which they are most readily manufactured in an individually protected form for handling and shipping. In overcoming the low terminal impedance of an IMPATT diode it is desirable to minimize the circuit energy storage associated with tuning and matching of a package-diode and thereby to maximize the potential bandwidth.

SUMMARY OF THE INVENTION

According to my invention, the foregoing problems are solved by providing an extra terminal to one end of the IMPATT diode or other semiconductor device to which a load is to be connected, while connecting the other terminal at that end to a shunt reactance tuning circuit in an arrangement that separates the shunt reactive tuning current from the load current. The load current is typically substantially smaller than the reactive tuning current. It is the large reactive tuning current component in conventional diode packages that causes a major part of the objectionable radio-frequency voltage loss at the package terminals.

One feature of my invention is the provision in a diode package of direct access to the semiconductor diode wafer by means of an additional lead. In order to appreciate the insight upon which this change is based, consider that normally all circuit techniques to be used by a circuit designer would have to start with the portion of the terminal that appears external to the diode package. In contrast, in the arrangement of my invention, the extra connection permits the circuit designer flexibility to reach back inside of the diode package itself. More specifically, the internal extra connection permits impedance matching without incurring the very unfavorable impedance transformation normally resulting from parasitic reactances of the package when connecting the load or source in series or in shunt with external tuning elements. This approach permits circuit energy storage in the load circuit to be minimized, yielding potentially broader bandwidth operation.

A further advantage of my invention is that the separation of the load, or source, connection from the tuning connection makes possible independent orthogonal adjustments for frequency and load coupling. Orthogonal adjustments are those adjustments in an electron circuit that do not interact with each other. Thus, difficult repetitive procedures for making the adjustments are avoided. Orthogonal adjustments of frequency and load coupling are difficult to achieve with a conventionally packaged diode, since the load must be connected in series or in parallel with the external tuning reactances through a common parasitic inductance.

It is further advantageous to use the circuit techniques of my invention with any microwave semiconductive devices that have substantially internal reactances that must be tuned out in matching to a load. When packaged, the device can be improved by my technique by avoiding the flow of the reactive tuning current and load current through a common parasitic inductance inherent in the package. While equivalent results could be achieved with unpackaged devices, it is an important aspect of my invention to realize that device packaging is often essential to reliability of mass-produced devices. Thus, the desirable results achieved by my invention have been achieved in a way that is compatible with high reliability mass production and broad commercial use of the microwave semiconductive devices.

The use of improved microwave semiconductive devices is particularly significant for high power solid state microwave amplifiers such as are used in radio relay common carriers communication systems and in many other apparatuses wherein encapsulation or packaging of a microwave semiconductive device is required.

BRIEF DESCRIPTION OF THE DRAWING

Further features and advantages of my invention will become apparent from the following detailed description taken together with the drawing, in which.

DESCRIPTION OF THE ILLUSTRATIVE EMBODIMENTS

Figure 1:
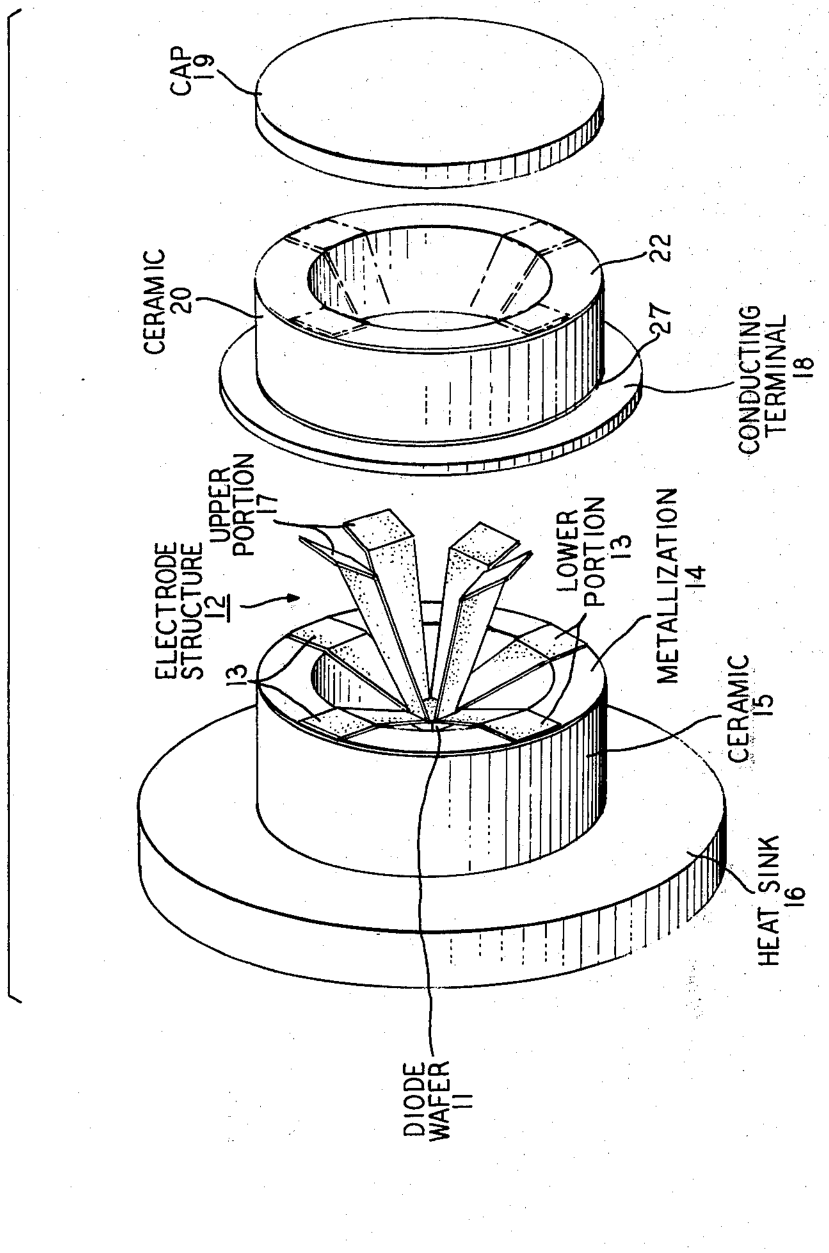
FIG. 1 is a pictorial perspective view in a partially-exploded form of an IMPATT diode assembly according to my invention.

The exploded view of an IMPATT diode in FIG. 1 illustrates in its preferred form how the extra terminal connection is provided to one end of an IMPATT diode wafer 11. While diode 11 may be more readily seen with respect to all of its terminal connections in FIG. 2, it is only important in FIG. 1 to observe that one region of the diode 11 to which terminal connection is to be made is just below the central circulator part of the electrode structure 12 in FIG. 1. Electrode structure 12 has upper and lower portions 17 and 13, respectively, both of the type generally known as a crossed-tape electrode, which is sometimes used in low-inductance packages for diode assemblies.

The lower crossed-tape portion 13 extends from the top of diode wafer 11 to the metallization ring 14 on top of ceramic cell 15 that surrounds diode 11 on the heat sink base 16. The lower crossed-tape portion 13 includes four thin metallic strips separated at 90° and extending in two very shallow V-forms from the top of the diode up to metallization ring 14. The upper crossed-tape portion 17 also includes four metallic strips separated by 90 degrees but extending in two steeper V-forms from the top of diode 11 up to a metallization ring 22 on top of an additional annular dielectric spacer 20 which is concentric with ceramic cell 15. Dielectric spacer 20 may also be a ceramic like the ceramic of cell 15. Between spacer 20 and the metallization ring 14 atop cell 15 is a relatively thick metal conducting terminal 18 on top of metallization ring 14 which extends substantially beyond the outer limit of metallization ring 14 and beyond the edges of cell 15, and spacer 20. Between conducting terminal 18 and spacer 20 there is a further metallization ring 27. All three of thin metallization rings 14, 27 and 22 help to bond together the immediately adjacent parts. Thereby bonded on top of metallization ring 22, to which the upper crossed-tape portion 17 extends, is the metallic cap 19 which provides the additional terminal which is the subject of the present invention and to which connection is readily made.

In prior crossed-tape packages, the four strips of the crossed-tape structure 13 provided one lead inductance. In the present dual crossed-tape structures, the upper and lower portions 13 and 17 provide separate metallization rings to which they are connected. The separate lead inductances, that is, the parasitic inductances, of these different structures have distinct roles in the circuits to which they are connected. As mentioned above, the respective connections are made to the extended annular conducting terminal 18 and to the metallic cap 19. It may be noted that the additional shunt capacitance provided by the additional electrode structure is mainly the capacitance that exists between terminals 18 and 19 through dielectric spacer 20. This capacitance is small in comparison with the capacitance of the diode wafer 11 to which they are connected.

The other connection to diode wafer 11 is made through the metallic heat sink base 16 which supports the dielectric cell 15 and wafer 11 centrally disposed in cell 15.

Figure 2:
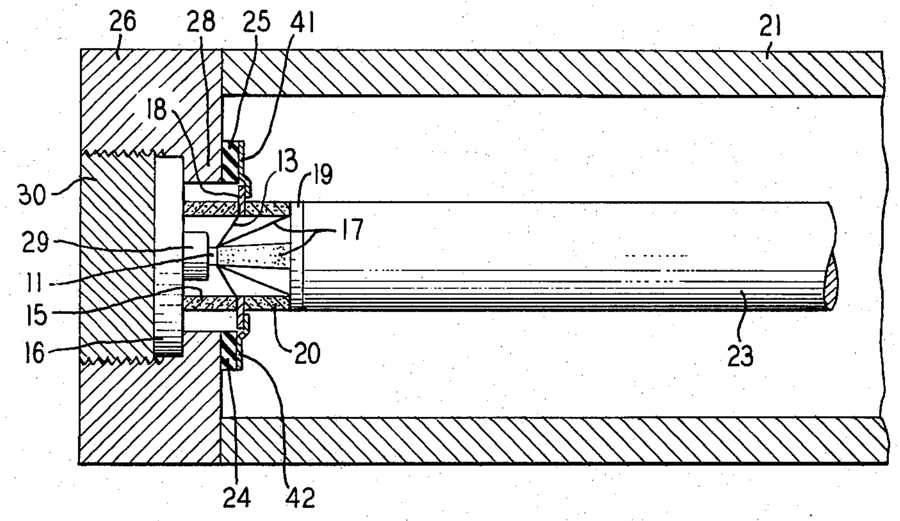
FIG. 2 is a partially pictorial and partially diagrammatic illustration, shown with a view through the diode package, of a coaxial transmission line employing my invention.

The complete assembly of the diode package into a coaxial cable circuit is shown in FIG. 2. It may be seen in this view, in which cell 15 is shown in section, that the other end of diode wafer 11 rests on conductive pedestal 29 which in turn provides electrical connection and heat-sinking of the diode to the metallic base plate 16. The base plate 16 is embedded by mechanical means in the end conductor plate 26 which is joined to and makes good electrical contact with hollow outer conductor 21 of the coaxial cable.

Optionally, heat sink base 16 may be mounted on a threaded member portion 30 centrally located in conductive end plate 26. In other words, the entire diode assembly, before connection to terminals 18 and 19 may be screwed into conductive plate 26 until base 16 firmly presses against a restraining annular portion 28 of plate 26 near to its inner surface.

At the other end of diode wafer 11, the metallic cap 19 which makes electrical connection to the diode through the upper crossed-tape portion 17 and metallization ring 22. Metallic cap 19 is used as the load circuit connection by joining it directly to the central conductor 23 of the coaxial cable. The coaxial cable formed by coaxial conductors 21 and 23 is illustratively a conventional 7-millimeter 50-ohm coaxial line which requires no transformer to couple it to the IMPATT diode assembly as shown.

In order to take advantage of the feature of my invention that allows the circuit designer direct access to the diode wafer 11 inside of the package formed by cell 15, the crossed-tape portion 13 is connected to a shunt reactance tuning circuit by joining extended conducting terminal 18 to two metallized rutile ($TiO_2$) capacitors 25. Metallic layers 41 and 42 form the top plates of the capacitors and are extended over the conducting terminal 18, thereby interconnecting the complete reactive tuning circuit and diode 11. The opposite plate of each capacitor is formed by portion 28 of the metallic end plate 26 of the coaxial line which is electrically connected through base plate 16 to the opposite diode terminal.

While it is envisioned that the capacitors 24 and 25 are essentially square in cross section and at most a couple of millimeters in each lateral dimension parallel to the plates, they could also be semicircular in extent or could join each other to form a complete annulus under terminal 18. The layers 41 and 42 would also form one annulus. The thickness of rutile elements of 24 and 25 between the conductive plates is typically 1 millimeter.

The operation of the assembly of FIG. 1, particularly as assembled into a circuit such as FIG. 2, can be compared to the performance of the conventional two terminal package similar to that of FIG. 1 but lacking the upper V-tape portion 17 and top plate 19.

The conventional circuit using a representative 6 GHz packaged IMPATT diode has a terminal impedance that illustratively has a negative real part of only 1.61 ohms. If this diode is shunt tuned with the load resistor directly across the diode terminals, the load resistance can be raised to 6.48 ohms. Unfortunately, the increase in usable load resistance is extremely critically dependent on the package parasitics inductances and capacitances and on the parameters of the wafer 11 inside the package. For one example, it can be calculated that with 4 watts output, a wafer voltage of 22.4 volts RMS has been transformed down to 5.09 volt RMS at the package terminal. The higher-voltage, higher-impedance terminal points unfortunately are inaccessible in the prior art packaged diode.

Figure 3:
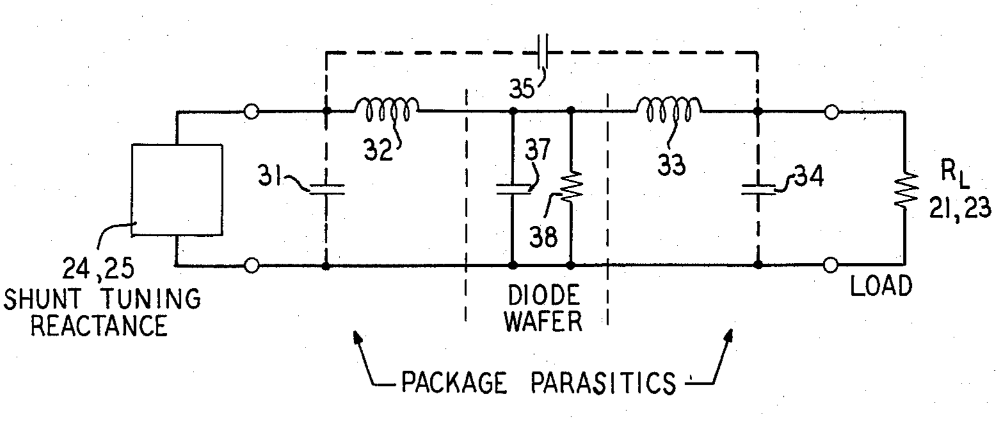
FIG. 3 shows the schematic equivalent circuit for the coaxial line circuit of FIG. 2.

In order to analyze the improved performance of the diode assembly and circuit according to my invention, the following analysis will be set out with the help of the equivalent circuit of FIG. 3. The load $R_L$, which in this case is the coaxial line 21, 23, is connected directly across the wafer via the terminal 19 in a manner less directly affected by the reactive current flowing through terminal 18 in the shunt tuning circuit, which is represented in the left-hand of the equivalent circuit of FIG. 3. This is true even if we assume that the parasitic inductance $L_{33}$ from the wafer 11 to load is as large or larger than the inductance $L_{32}$ in the shunt tuning circuit. In the first case, part of the lead inductance is due to the crossed-tape upper portion 17 of electrode structure 12; in the second case, the lead inductance is partly due to the crossed-tape lower portion 13 of electrode structure 12. Similar parasitic capacitors 31 and 34 shunt the shunt tuning reactance 23 and 24 and the load $R_L$, respectively. In other words, the load is connected directly to the wafer via the added terminal 19; while the normal terminal 18 is connected to capacitors 24 and 25, so that the series combination of its lead inductance, $L_{32}$, and the capacitance $C_{31} + C_{24} + C_{25}$, tunes out the reactance, $X_{37}$, of the semiconductor wafer and package parasitics. Note that the parasitic inductance, $L_{32}$, is essential in this tuning circuit. In this configuration, the full wafer voltage is applied effectively from a high source impedance to the load. Since only the load current (typically a factor of 5 to 10 times less than the reactive tuning current) flows through the added terminal 17, 19, there is a relatively small voltage drop across the parasitic inductance of this terminal, despite the fact that it can have a larger inductance than a normal crossed-tape package terminal. The reduced voltage drop is primarily due to the dramatically reduced current through this lead inductance. Indeed, by constructing the characteristic impedance level of this added terminal to match the impedance of the tuned wafer 11 and the components to the left of 11 in FIG. 3, the parasitic effects of the packaging of the diode can be virtually eliminated.

For the specific equivalent circuit shown, the diode wafer conductance of about 0.008 mhos requires a shunt load resistance of 125 ohms. A parasitic inductance of about 0.3 nanoHenrys in the added terminal provides a reactance of about 11 ohms which has a relatively small effect in a 125-ohm circuit.

In the practical application of the principles just mentioned in the circuit of FIG. 2, the shunt tuning reactances in the form of capacitors 24 and 25 have been mounted as part of the diode and end plate assembly for the coaxial line.

A three-terminal gallium arsenide IMPATT diode has been fabricated, mounted in a 50 ohm coaxial test circuit of the type shown in FIG. 2 and successfully operated. A very large-area diode junction was used which had a capacitance at breakdown of about 4.4 picoFarads (2 to 3 times that of diodes normally tested). The diode reactance was tuned out with the lead inductance of terminal 18, together with a pair of parallel-connected rutile capacitors 24 and 25 coupled to the diode cell or package 15. With a more conventional diode assembly, the series connected load impedance would have had to have been transformed down to about 1 ohm or less to obtain successful operation. Nevertheless, in the particular assembly of FIG. 2, in which the three terminals were connected the diode operated successfully directly into the 50 ohm impedance of the test circuit. It produced about 2 watts of RF power at 4.2 GHz onto the coaxial line 21, 23. The diode was biased by 300 milliamperes direct current at 120 volts through the coaxial line 21, 23 itself. In practical applications, bias would be provided to the diode through the coaxial line by conventional bias T's (not shown) which are commercially available and which can be readily assembled with a conventional coaxial line.

It should be noted that the factor of advantage obtained by reducing reactive current in the lead inductance extending to the load in the general application of a diode assembly to my invention is directly related to the ratio of the susceptance of the diode (capacitor 37 in FIG. 3) and the magnitude of the internal diode conductance 38. That is, the factor of advantage is approximately the ratio of $B_{C_{37}}/G_{38}$. For the typical semiconductive diode, such as an IMPATT diode, this ratio is approximately somewhere between 5 and 10, as described above. It should be appreciated that the present invention can be applied to avoid degrading the effective terminal impedance between any two points in a semiconductive device, such as a field effect transistor, having package parasitics and requiring reactive tuning.

The role of the two terminals can be reversed for use with microstrip, where the load is connected on the microstrip at terminal 18 much in the manner that the rutile capacitors are connected in FIG. 2. The tuning can then be achieved by additional reactive elements connected to the end terminal 19. The reactive elements are readily positioned above the compact microstrip structure and can readily have their ground terminals connected around the microstrip structure to the ground plane.

I claim:

1. A microwave apparatus comprising a solid state semiconductive device having a first output impedance in the absence of packaging, said device having at least two regions having differing conductivity types and an interface between said regions characterizable as a semiconductive junction, dielectric means for packaging said device, the dielectric means admitting the passage therethrough of terminals for connecting said device to external microwave circuits, at least three terminals connecting to said device through said dielectric means, two of said terminals having substantial inductances and being attached to the same region of said device, said two terminals having parasitic inductances and capacitances located predominantly within said dielectric means, and an external capacitance connected between one of said two terminals and the third terminal and tuned to draw a reactive tuning current sufficient to increase the resistive component of impedance presented between the second of the two terminals and the third terminal.

2. A microwave apparatus according to claim 1 in which the two terminals form two crossed-tape structures including respective separate conductive rings and dielectric means separating said rings.

3. A microwave apparatus according to claim 2 in which the other terminal of the two terminals includes a substantially planar, conductive end part adapted for contacting the center conductor of a coaxial load and contacting the respective crossed-tape structure.

* * * * *